United States Patent
Sjoroos et al.

(10) Patent No.: US 10,261,122 B2
(45) Date of Patent: Apr. 16, 2019

(54) AGING DETERMINATION OF POWER SEMICONDUCTOR DEVICE IN ELECTRIC DRIVE SYSTEM

(71) Applicant: ABB OY, Helsinki (FI)

(72) Inventors: Jukka-Pekka Sjoroos, Brookfield, WI (US); Kari Tikkanen, New Berlin, WI (US)

(73) Assignee: ABB Schweiz AG, Baden (CH)

( * ) Notice: Subject to any disclaimer, the term of this patent is extended or adjusted under 35 U.S.C. 154(b) by 370 days.

(21) Appl. No.: 15/192,579

(22) Filed: Jun. 24, 2016

(65) Prior Publication Data

US 2016/0377671 A1 Dec. 29, 2016

Related U.S. Application Data

(60) Provisional application No. 62/184,654, filed on Jun. 25, 2015.

(51) Int. Cl.
| | |
|---|---|
| *G01R 31/26* | (2014.01) |
| *H02P 29/02* | (2016.01) |
| *H02M 1/32* | (2007.01) |
| *H02M 7/48* | (2007.01) |
| *G01R 31/00* | (2006.01) |

(52) U.S. Cl.
CPC ..... *G01R 31/2608* (2013.01); *G01R 31/2642* (2013.01); *G01R 31/005* (2013.01); *H02M 1/32* (2013.01); *H02M 7/48* (2013.01); *H02P 29/02* (2013.01)

(58) Field of Classification Search
CPC ............... G01R 31/26; G01R 31/2642; G01R 31/2648; G01R 31/2831; G01R 31/31702
See application file for complete search history.

(56) References Cited

U.S. PATENT DOCUMENTS

| | | | |
|---|---|---|---|
| 5,877,419 A | 3/1999 | Farokhzad | |
| 7,330,046 B2 | 2/2008 | Durbaum | |
| 7,904,254 B2 | 3/2011 | Ibori | |
| 8,600,685 B2 | 12/2013 | Kalgren et al. | |
| (Continued) | | | |

FOREIGN PATENT DOCUMENTS

WO 2007008940 1/2007

OTHER PUBLICATIONS

Yali Xiong, et al., "Prognostics and Warning System for Power—Electronic Modules in Electric, Hybrid Electric and Fuel Cell Vehicles", IEEE Transactions on Industry Applications, vol. 55, No. 6, Jun. 2008, pp. 2268-2276.

(Continued)

*Primary Examiner* — Tung X Nguyen
(74) *Attorney, Agent, or Firm* — Taft Stettinius & Hollister LLP; J. Bruce Schelkopf (57) ABSTRACT

Monitoring aging in an electric drive system includes energizing the electric drive system such that electrical current flows through a power semiconductor device therein, determining a value indicative of a voltage across the power semiconductor device, at a current level where voltage is substantially independent of temperature, comparing the determined value with a reference value, and outputting a signal responsive to a difference between the values that is indicative of an aging state of the power semiconductor device.

29 Claims, 6 Drawing Sheets

(56) References Cited

U.S. PATENT DOCUMENTS

| | | |
|---|---|---|
| 2004/0247080 A1* | 12/2004 | Feda .................... G01N 23/223 |
| | | 378/101 |
| 2009/0160476 A1 | 6/2009 | Omaru |
| 2011/0015881 A1 | 1/2011 | Chen |
| 2013/0328596 A1 | 12/2013 | Zoels |
| 2014/0022008 A1* | 1/2014 | Noorlag .................... G06F 1/26 |
| | | 327/540 |
| 2014/0125366 A1 | 5/2014 | Thogersen et al. |
| 2014/0253170 A1 | 9/2014 | Lipp |

OTHER PUBLICATIONS

Martin Knecht, "Datasheet Technical Information", FF300R12KE3 Infineon Technologies, Jun. 27, 2007.
U. Scheuermann, et al., "Power Cycling Lifetime of Advanced Power Modules for Different Temperature Swings", Semikron Elektonik Nuremger Germany, Apr. 8, 2014, pp. 1-6.
Arendt Wintrich, et al., "Application Manual Power Semiconductors", Semikron International GmbH.
Allen R. Hefner, Jr. "A Dynamic Electro-Thermal Model for the IGBT", IEEE Transactions on Industry Applications, vol. 30, No. 2, Mar./Apr. 1994, pp. 398-405.
Yong-Seok Kim, et al. "On-Line Estimation of IGBT Junction Temperature Using On-State Voltage Drop", IEEE Transactions on Industry Applications, Jan. 1998, pp. 853-859.
Ghimire Pramod et al. "Improving Power Convertere Reliability: Online Montioring of High-Power IGBT Modules", IEEE Industrial Electronics Magazine, Vol, 8, No. 3, Sep. 1, 2014, pp. 40-50.

* cited by examiner

AGING DETERMINATION OF POWER SEMICONDUCTOR DEVICE IN ELECTRIC DRIVE SYSTEM

TECHNICAL FIELD

The present disclosure relates generally to monitoring health of electric drive systems, and more particularly to determining an aging state of a power semiconductor device in an electric drive system.

BACKGROUND

A great many different types of machines are powered primarily or in part with electric drive systems. Examples include electrically propelled land and water vehicles, industrial equipment, elevators, and many others. Like all mechanical and electromechanical systems fatigue can occur over time, leading to performance degradation or failure. Manufacturing tolerances and other factors such as duty cycle and environmental conditions can affect the likelihood of failure at any given time, and thus great variation in the field service life of electric drives is observed. The industry is therefore welcoming of advances in relation to detecting and predicting failure.

SUMMARY

Monitoring aging in an electric drive system includes energizing the system such that electrical current flows through a power semiconductor device therein. Observations of the voltage across the power semiconductor device at certain levels of the electrical current can be exploited to determine an aging state of the power semiconductor device.

DETAILED DESCRIPTION OF ILLUSTRATIVE EMBODIMENTS

For purposes of promoting an understanding of the principles of the AGING DETERMINATION OF POWER SEMICONDUCTOR DEVICE IN ELECTRIC DRIVE SYSTEM, reference will now be made to the examples illustrated in the drawings, and specific language will be used to describe the same. It will nonetheless be understood that no limitation of the scope of the invention is intended by the illustration and description of certain examples of the invention. In addition, any alterations and/or modifications of the illustrated and/or described embodiment(s) are contemplated as being within the scope of the present invention. Further, any other applications of the principles of the invention, as illustrated and/or described herein, as would normally occur to one skilled in the art to which the invention pertains, are contemplated as being within the scope of the present invention.

Figure 1:
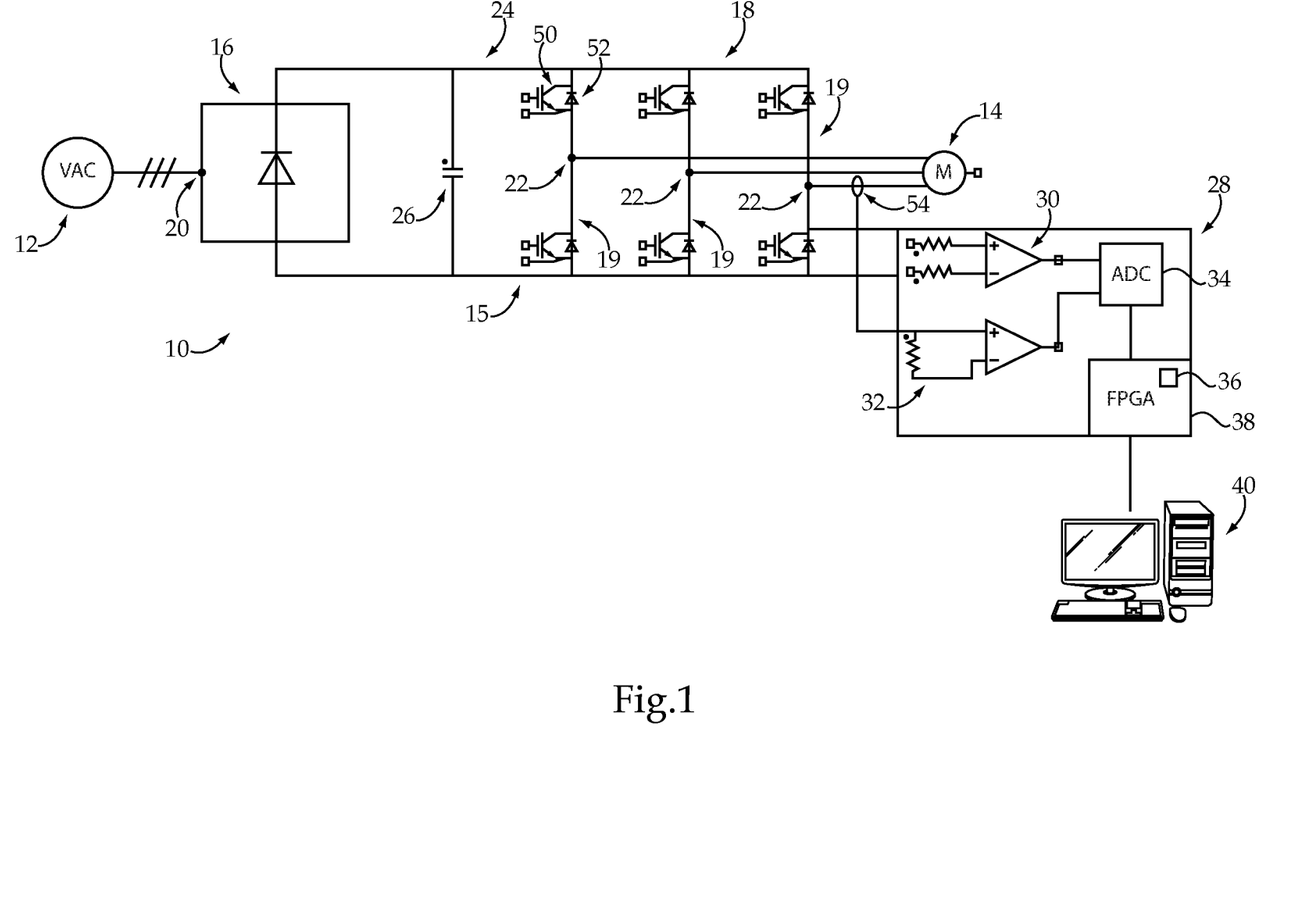
FIG. 1 is a schematic view of an electrical drive system according to one embodiment.

Referring to FIG. 1, there is shown an electric drive system 10 according to one embodiment, and structured so as to supply electrical power from a power supply 12 such as a three-phase alternating current (AC) power supply 12 to an external electrical load 14. Power supply 12 might include an AC electrical grid such as a municipal electrical grid, an industrial electrical grid, or an onsite generator such as a wind generator, a hydroelectric generator, or a combustion engine generator. External load 14 may include an electric motor such as an AC electric motor or a DC electric motor in a traction mechanism for vehicle propulsion, an electrically powered rotary or linear actuator for all manner of industrial or manufacturing processes, an electric heater, or still another application such as an electric motor for powering an elevator. For reasons that will be further apparent from the following description, system 10 is uniquely structured so as to enable prognostic evaluation of remaining service life for certain components in system 10, as well as having applications at or prior to ever placing system 10 or certain components thereof into service.

In the illustrated embodiment, system 10 includes a power module 15 having a front end 16 with input nodes 20 coupled with power supply 12. Front end 16 may include a rectifier such as an actively controlled or a passive rectifier, although the present disclosure is not thereby limited. Power module 15 may further include a DC link 24 having a DC link capacitor 26 that couples front end 16 with a back end 18. Back end 18, discussed in more detail below, may include output nodes 22 that connect power module 15 with external load 14. In the illustrated embodiment, back end 18 includes three phase legs 19 that can be coupled with three or any multiple of three motor windings in motor 14, for instance. In other embodiments, a different number of legs and/or motor windings might be used. Embodiments are contemplated where only a single leg is used in electric drive system 10.

System 10 may further include a monitoring and control mechanism 28. Mechanism 28 may be equipped with certain components for monitoring various states of electric drive system 10, including an aging state or other factors relating to the health of electric drive system or components thereof, as further discussed herein. Mechanism 28 in particular may include an analog to digital converter (ADC) 34, a field programmable gate array (FPGA) 38 that includes a controller 36, a voltage sensing mechanism 30 and a phase current sensor 32, the operation of all of which will be further apparent from the following description.

Power module 15 may further include a plurality of power semiconductor devices. In a practical implementation strategy, each of legs 19 is equipped with two sets of two power semiconductor devices, each including a transistor 50 and a diode 52 together in the nature of an insulated gate bipolar transistor (IGBT) module. Transistor 50 and diode 52 may have opposite polarities, and are connected electrically in parallel with one another such that diode 52 functions as a so-called freewheeling diode 52.

Voltage sensing mechanism 30 may be structured to sense a voltage across each one of power semiconductors 50 and 52. It has been discovered that voltage across a power semiconductor, and in particular a voltage across a power semiconductor at certain current levels, may be substantially independent of temperature. This discovery is exploited according to the presented disclosure to observe voltage across a power semiconductor, and in particular changes in voltage drop across a power semiconductor over time, so as to determine a relative aging state of a power semiconductor in the field and where the power semiconductor is in an on-state. In system 10, phase current sensing mechanism 32 can be used to detect phasing of electrical currents supplied to motor/load 14, and thereby determine which of power semiconductor components 50 and 52 is passing electrical current at any given time. A positive or forward electrical current means that the transistors in the corresponding phase leg 19 are conducting electrical current, whereas a negative or reverse electrical current means that the corresponding diodes are conducting electrical current. A sensing lead or contact 54 is shown connecting one phase with phase current sensing mechanism 32. Mechanism 30 can be used via appropriate connections to power module 15 to sense voltage across any of transistors 50 as well as any of diodes 52, and thereby determine or estimate an aging state thereof, as further discussed herein.

As noted above, FPGA 38 may include a controller 36, including any suitable microprocessor. In a practical implementation strategy, controller 36 may be structured by way of suitable programming to determine a value indicative of voltage across any one of the power semiconductor devices as discussed herein. The value determination/voltage sensing is of interest when electrical current through the subject power semiconductor device is at a level where the voltage is substantially independent of a temperature of that power semiconductor device. Those skilled in the art will appreciate that the determined value could be a magnitude of the voltage, a resistance, or perhaps still another value such as a more qualitative value that indicates whether a voltage across the subject power semiconductor is low, medium, high, extra high, etc. Controller 36 may be further structured to compare the determined value with a reference value, and output a signal indicative of an aging state of the subject power semiconductor device, responsive to a difference between the determined value and the reference value.

Also coupled with mechanism 28 is a user interface 40, such as a desktop or laptop computer or a dedicated electric drive system service tool. In certain embodiments, the signal output via controller 36 might be a warning signal where the voltage across any one of the power semiconductor devices is greater than a certain value, or greater than a certain value by a predefined amount or degree, as further discussed herein. It should be appreciated that placing certain of the control functions contemplated herein in or on controller 36 is but one of a number of different strategies that might be employed, and the particular location of control functions described is not intended to be limiting.

Figure 2:
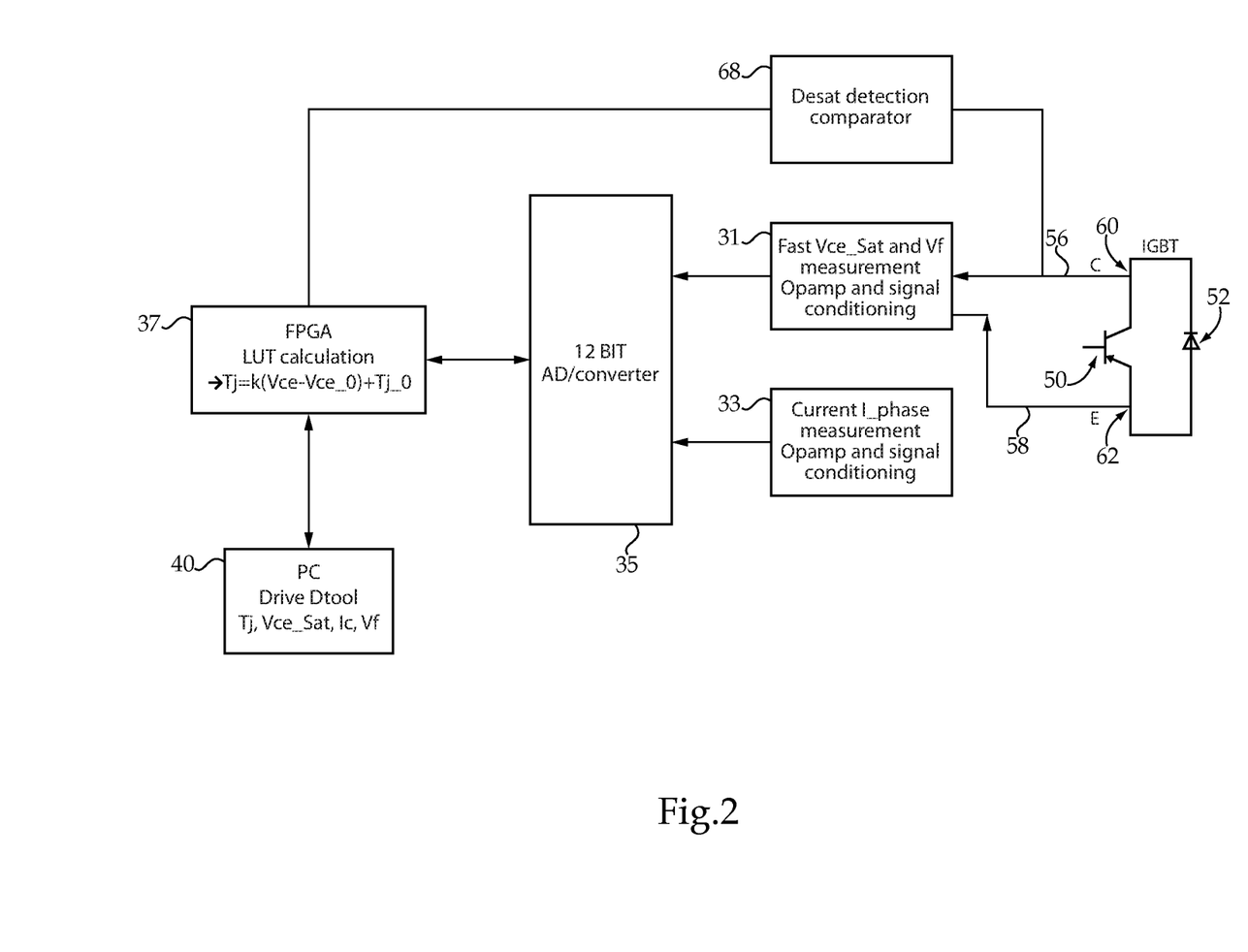
FIG. 2 is a block diagram of digital logic implemented in connection with operating the system of FIG. 1.

Referring now to FIG. 2, there is shown a block diagram illustrating control logic executed in connection with operating electric drive system 10. In FIG. 2, power semiconductor device 50 is shown coupled electrically in parallel with power semiconductor device 52. In the case of a transistor, device 50 includes a collector 60 and emitter 62, with electrical sensing leads 56 and 58 of sensing mechanism 30 connected thereto. It can be seen from FIG. 2 that sensed voltage at collector 60 and sensed voltage at emitter 62 are considered at block 31, where a number of functions are executed including a fast Vce_sat and Vf measurement via an operational amplifier, and signal conditioning. Generally in parallel, current phase measurement via an operational amplifier, and signal conditioning occurs at block 33. A Desat detection comparator block 68 is shown in parallel with blocks 31 and 33. Outputs of blocks 31 and 33 are processed analog to digital at block 35. At block 37 a lookup table (LUT) calculation to estimate junction temperature of the corresponding power semiconductor based on the sensed voltage drop is performed. Block 40 represents the tool or operator interface 40 where junction temperature, voltage across the power semiconductor device 50, current, voltage across power semiconductor device 52, and aging state or still other factors are evaluated and optionally displayed or made available to an operator or service technician.

Figure 3:
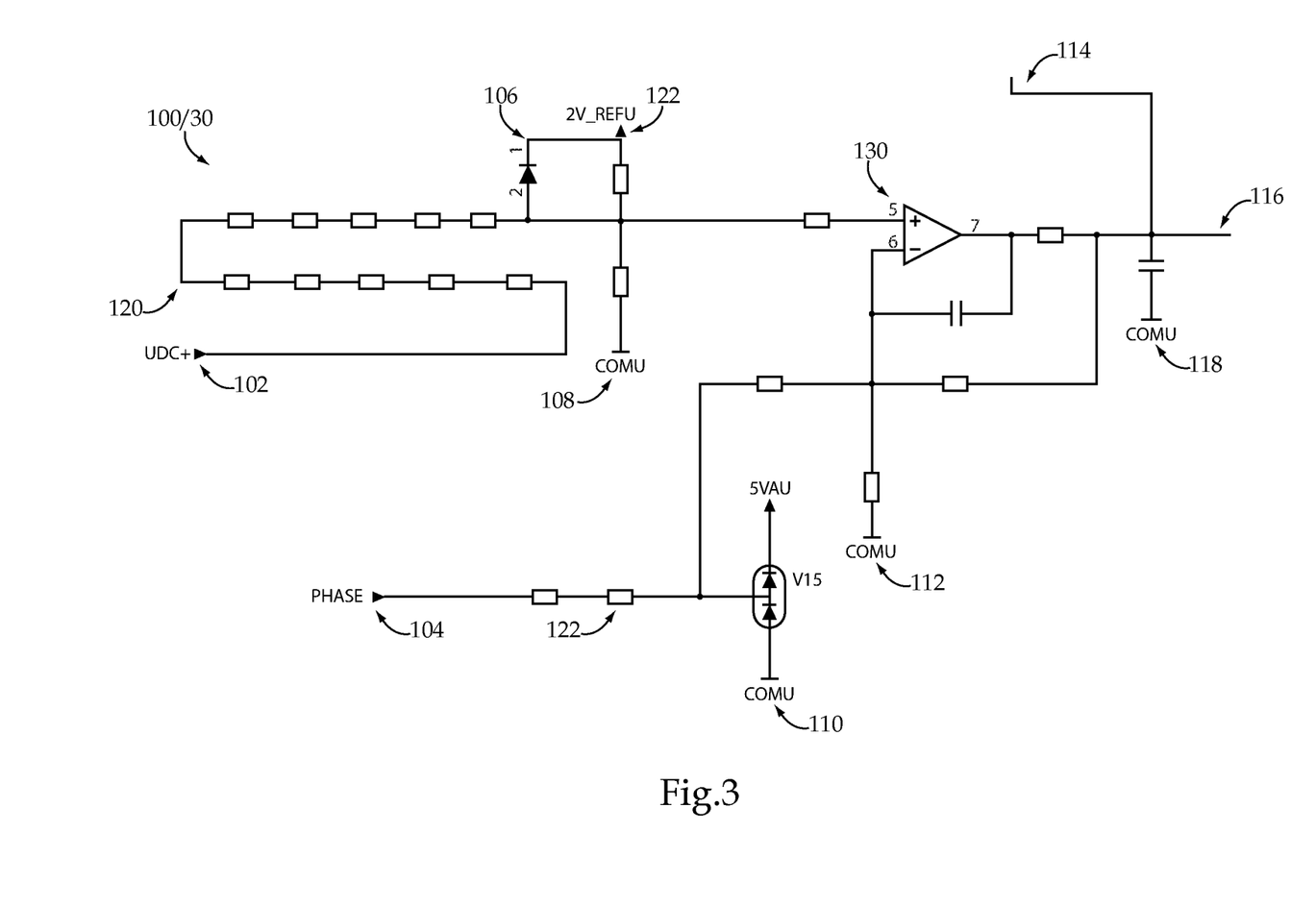
FIG. 3 is a circuit schematic of a circuit for monitoring voltage across a semiconductor, according to one embodiment.

Referring now to FIG. 3, there is shown circuitry 100 of sensing mechanism 30 in greater detail. In FIG. 3, a first input lead 102 or terminal UDC+monitors voltage of the collector 60 and/or cathode of diode 52, whereas a second input or sensing lead 104 PHASE monitors voltage of emitter 62 and/or the anode of diode 52. Also shown in FIG. 3 is a first resistor string 120 coupled between lead 102 and a clamping component 106 that clamps input voltage during an off state of transistor 50. Clamping component 106 may include a diode and a +2V reference voltage terminal. The +2V reference voltage compensates for different voltage drop ranges associated with transistor 50 versus diode 52. Adding 2V thus allows the same circuit to be used for sensing voltage across either of transistor 50 or diode 52, with the sensed voltages being processed according to different control logic. It will be recalled that phase current measurement is used to determine which of the power semiconductors is to be evaluated, in other words which control logic is to be called. A ground potential is shown via reference numeral 108. Another resistor string 122 is coupled to lead 104. An operational amplifier 130 compares voltage sensed via input 102 with voltage sensed via input 104, compensated by clamping component 106, and outputs a difference between the two for further processing as described herein. Reference potentials are shown via numerals 110 and 112 and also 118. Additional resistive elements are shown but not specifically numbered. An output of operational amplifier 130 is provided to two channels 114 and 116 for processing in the manner described herein.

Figure 4:
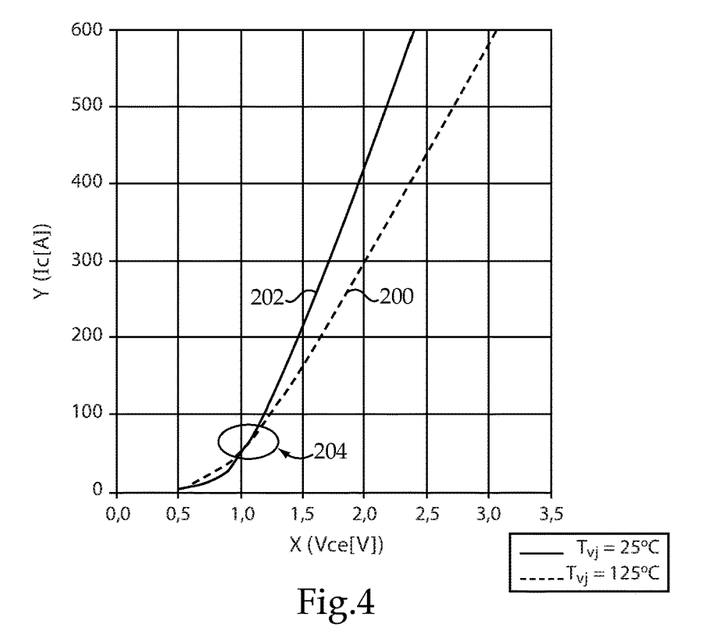
FIG. 4 is a graph of voltage and current relation at different temperatures for a first power semiconductor device.
Figure 5:
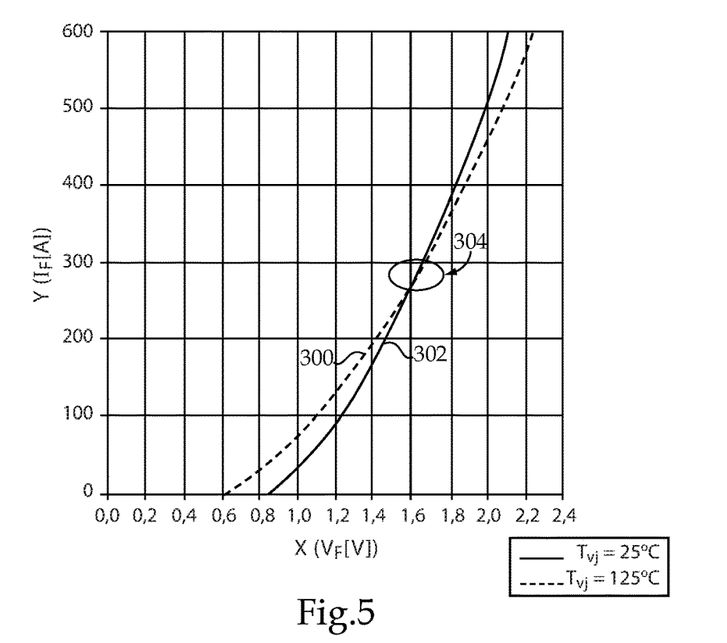
FIG. 5 is a graph of voltage and current relation at different temperatures for a second power semiconductor device.

As noted above, voltage measurements or determination of values indicative of voltage will take place when an electrical current through the power semiconductor device of interest is at a level where the relation between current level and voltage is substantially independent of temperature. Another way to understand this principle is that while temperature is usually a factor that affects what current will be induced by a particular voltage potential, it has been discovered that there are certain current levels where the temperature can be ignored. FIG. 4 illustrates the case of one IGBT where voltage across the IGBT, in other words a voltage drop between the collector and emitter, is substantially independent of temperature at a level that is from about 50 amps to about 75 amps, and in particular may be about 70 amps. In FIG. 4, a first graph line 200 illustrates electrical current level at different voltages while the temperature of the semiconductor, in particular the silicon temperature, is at about 125° C. A second graph line 202 represents current level at voltages where the silicon temperature is at about 25° C. It can be seen that graph lines 200 and 202 approach one another and cross at a point 204 in the range of current level previously noted, indicating substantial independence to temperature difference. In the case of FIG. 5, there are shown graph lines 300 and 302 illustrating similar relation between voltage and current for a diode. It can be seen that the crossover point 304 is different from the crossover point for the transistor, and in particular is from about 275 amps to about 300 amps, and in particular from about 295 amps to about 300 amps. It will be recalled that voltage drop across a power semiconductor device has been discovered to be related to an aging state of the power semiconductor device. In the case of the FIG. 4 and FIG. 5 examples, it can be seen that there are certain current levels where temperature dependence of the voltage drop can be ignored and therefore the voltage drop measured can be understood to be a direct result of aging. Crossover points, and thus temperature independent current levels, can be empirically determined.

Figure 6:
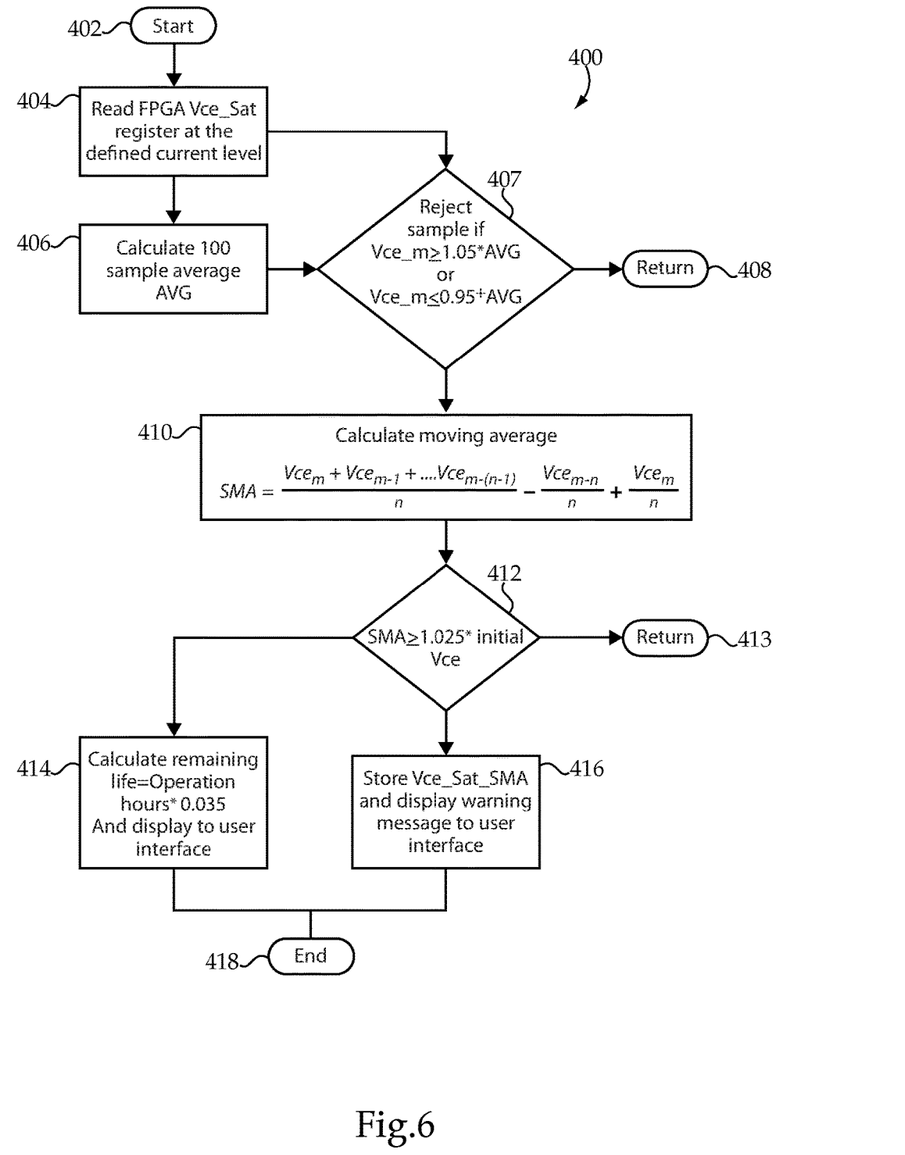
FIG. 6 is a flow diagram of a process according to one embodiment.

Referring now to FIG. 6, there is shown a flow diagram 400 where steps in an example control process are illustrated. The process of flow diagram 400 may take place while system 10 is energized and one or more of the semiconductors therein are actively supplying power to load 14. Energizing system 10 may include energizing system 10 such that electrical current flows through one or more of the semiconductors at levels where the relation between voltage and current level is temperature dependent, and may also include energizing system 10 such that electrical current flows through one or more of the semiconductors at levels where the relation is substantially temperature independent. The process of flow diagram 400 may commence at step 402, from which the logic may advance to step 404 to read FGPA, Vce_sat register at the defined current level. It will this be understood that at block 404 a reading is taken that determines voltage across a power semiconductor device of interest. From step 404, the logic may advance to step 406 to calculate a 100 sample average, AVG, and also to step 406. At step 406, a sample may be rejected if the measured voltage Vce_m is greater than or equal to 1.05 times AVG or less than or equal to 0.95 times AVG. At step 406, the logic may be thought of as rejecting measurements that are deemed too far out of range or outliers from the average to be reliable data, and are rejected such that the logic returns at step 408. If the sample at 406 is not rejected, the logic may advance to block 410 to calculate a moving average SMA. From step 410, the logic may advance to step 412 where the moving average SMA is determined greater than or equal to 1.025 times the initial Vce. Another way to understand the operation at step 412 is that a determination is being made as to whether the moving average has now exceeded an initial voltage by a predefined amount, in other words a reference value or reference voltage associated with the particular power semiconductor or power semiconductors of a particular class. The reference value can be empirically determined through testing prior to placing a power semiconductor device in service.

At step 412 it can also be understood that a determination is made as to whether voltage drop across a power semiconductor device has increased after having been placed in service by at least 2.5%. Any threshold might be set for voltage increase as in step 412. For instance, a 2% increase might be determined to be appropriate for further action as described herein, a 3%, or still another proportional change. It should nevertheless be appreciated that an increase of 2% or greater, and in particular about 2.5% or greater has been discovered to be indicative of changes in voltage drop that are just prior to an acceleration in rate of change of voltage drop that is indicative of near term or relatively near term end of life of the power semiconductor device, and ultimately failure of the associated electric drive system. In one practical implementation strategy, when voltage drop has increased by about 2.5%, it can be determined that the power semiconductor device has about 3.5% of its service life left before catastrophic failure will occur. If the conditions are not met at step 412, the logic may return at step 413.

If the conditions are met at step 412, the logic may advance to step 414 to calculate remaining life. As noted above, logged hours of operation may be multiplied by a proportional multiplier, in the illustrated case a numeric multiplier equal to 0.035, and the resultant product displayed to the associated user interface. Another way to understand the calculation is that where voltage drop increases by about 2.5% since a power semiconductor device is placed in service, it can be concluded that the device has about 3.5% of life remaining before failure. In one embodiment, controller 30 may log a fault responsive to the difference between a determined value indicative of voltage across the power semiconductor and a reference value. Aging state as described herein may thus be a 96.5% aging state, a 90% aging state, a 99% aging state, or still another quantitative or qualitative measure. Triggering of a fault could occur at any aging state deemed appropriate, and could vary dependent upon the type and manufacturer of power semiconductor, or based upon still other factors. In parallel to step 414, the logic may at step 416 store the voltage sensed and display a warning message to the user interface as appropriate. The logic may exit, and the flow diagram process end at step 418.

Figure 7:
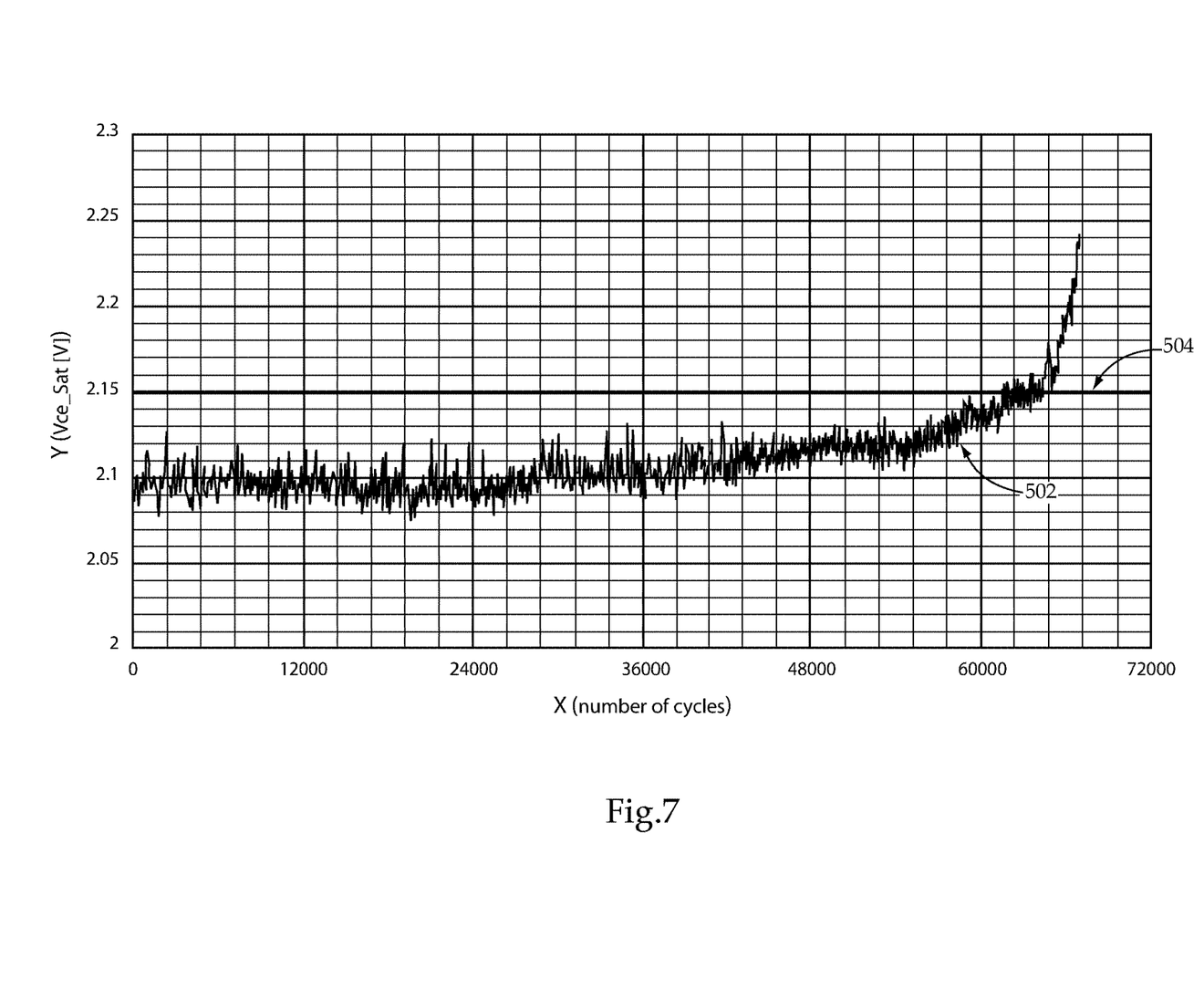
FIG. 7 is a graph of power cycling in relation to voltage drop across a power semiconductor device, according to one embodiment.

Referring now to FIG. 7, there is shown a graph where number of cycles are shown on the X-axis and voltage or voltage drop is shown on the Y-axis. It can be seen that for the illustrated case of an IGBT that there is a relatively gradual increase in voltage drop over many thousands of cycles of turning on and off, but that beginning between about 50,000 cycles and about 60,000 cycles the increase in rate of change in voltage drop occurs. A threshold voltage is shown on the graph and indicates approximately a voltage where it could be concluded that the IGBT service life is near its end, and a warning signal sent to the user interface as described herein.

The present description is for illustrative purposes only, and should not be construed to narrow the breadth of the present disclosure in any way. Thus, those skilled in the art will appreciate that various modifications might be made to the presently disclosed embodiments without departing from the full and fair scope and spirit of the present disclosure. Other aspects, features and advantages will be apparent upon an examination of the attached drawings and appended claims.

What is claimed is:

1. A method of monitoring aging in an electric drive system comprising:
    energizing the electric drive system such that electrical current flows through a power semiconductor device in the electric drive system;
    determining a value indicative of a voltage across the power semiconductor device while providing a level of the electrical current where the voltage is substantially independent of a temperature of the power semiconductor device;
    comparing the determined value with a reference value; and
    outputting a signal indicative of an aging state of the power semiconductor device responsive to a difference between the determined value and the reference value.

2. The method of claim 1 further comprising powering an external load via the electric drive system, during the energizing of the electric drive system.

3. The method of claim 1 wherein the determined value includes an average value of the voltage in a plurality of sampling periods after placing the power semiconductor device in service in the electric drive system, and wherein the reference value includes a stored reference value indicative of a starting voltage across the power semiconductor device prior to service in the electric drive system.

4. The method of claim 1 wherein outputting a signal includes outputting a warning signal to a user interface of the electric drive system where the difference is indicative of an aging state of about 90% or greater.

5. The method of claim 4 wherein outputting a signal includes outputting the warning signal where the difference is indicative of an increase in voltage drop across the power semiconductor of about 2% or greater.

6. The method of claim 1 further comprising calculating a remaining life of the power semiconductor device responsive to the signal at least in part by multiplying logged service hours of the power semiconductor device by a proportional multiplier.

7. A method of determining health of power semiconductor devices in an electric drive system comprising:
energizing the electric drive system such that electrical current flows through a power semiconductor device therein at a first level where a relation between electrical current level and voltage across the power semiconductor device is dependent on temperature;
energizing the electric drive system such that electrical current flows through the power semiconductor device at a second level where the relation is substantially independent of temperature;
sensing voltage across the power semiconductor device where the electrical current is at the second level; and
setting a fault responsive to the sensed voltage.

8. The method of claim 7 wherein the power semiconductor device includes an insulated gate bipolar transistor (IGBT), and the first level is from about 50 Amps to about 75 Amps.

9. The method of claim 7 wherein the power semiconductor device includes a freewheeling diode, and the first level is from about 75 Amps to about 100 Amps.

10. The method of claim 7 wherein sensing the voltage includes sensing the voltage in a plurality of sampling periods so as to determine an average voltage, and further comprising comparing the average voltage with a reference voltage.

11. The method of claim 10 wherein the power semiconductor device is in an on-state and the electric drive system supplies electrical power to an external electrical load during the energizing of the electric drive system.

12. An electric drive system comprising:
a power module for conveying electrical power between an electrical power supply and an external electrical load;
a power semiconductor device within the power module;
a sensing mechanism having sensing leads coupled to electrical terminals of the power semiconductor device, and a controller coupled to the sensing leads;
the controller being structured to determine a value indicative of a voltage across the power semiconductor device when electrical current through the power semiconductor device is at a level where the voltage is substantially independent of a temperature of the power semiconductor device; and
the controller being further structured to compare the determined value with a reference value, and to output a signal indicative of an aging state of the power semiconductor device responsive to a difference between the determined value and the reference value.

13. The electric drive system of claim 12 further comprising a user interface coupled with the sensing mechanism, and wherein the signal includes a warning signal and the controller is further structured to output the warning signal to the user interface where the difference is indicative of an expected increase in a rate of change of the voltage over a plurality of power cycles.

14. The electric drive system of claim 13 wherein the power semiconductor device includes a transistor, and the sensing leads of the sensing mechanism are coupled to a collector and an emitter of the transistor.

15. The electric drive system of claim 14 wherein the transistor includes an insulated gate bipolar transistor (IGBT).

16. The electric drive system of claim 14 further comprising a freewheeling diode connected electrically in parallel with the transistor.

17. The electric drive system of claim 16 wherein the sensing mechanism further includes a comparator coupled with each of the freewheeling diode and the transistor via the sensing leads.

18. The electric drive system of claim 12 further comprising a plurality of input nodes for coupling the electric drive system with a plurality of phases of an AC power supply, and a plurality of output nodes for coupling the electric drive system with an external load, and the power semiconductor device including one of a plurality of power semiconductor devices coupled between the input nodes and the output nodes.

19. The electric drive system of claim 18 wherein the sensing mechanism is structured to sense the voltage across the power semiconductor device when the power semiconductor device is energized and the electric drive system supplies electrical power from the AC power supply to the external load.

20. A method of monitoring aging in an electric drive system comprising:
energizing the electric drive system such that electrical current flows through a power semiconductor device in the electric drive system;
determining a value indicative of a voltage across the power semiconductor device, at a level of the electrical current where the voltage is substantially independent of a temperature of the power semiconductor device;
comparing the determined value with a reference value; and
outputting a signal indicative of an aging state of the power semiconductor device responsive to a difference between the determined value and the reference value;
wherein the power semiconductor device includes a transistor and the act of determining includes determining a voltage drop via sensing leads electrically connected to a collector and an emitter of the transistor.

21. The method of claim 20 wherein the act of determining includes determining that the determined value is indicative of a voltage across the transistor in response to a phase current measurement, and processing the determined value with control logic selected in response to the act of determining that the determined value is indicative of the voltage across the transistor.

22. The method of claim 20 wherein the determined value includes an average value of the voltage in a plurality of sampling periods after placing the power semiconductor device in service in the electric drive system, and wherein the reference value includes a stored reference value indicative of a starting voltage across the power semiconductor device prior to service in the electric drive system.

23. A method of monitoring aging in an electric drive system comprising:
   energizing the electric drive system such that electrical current flows through a power semiconductor device in the electric drive system;
   determining a value indicative of a voltage across the power semiconductor device, at a level of the electrical current where the voltage is substantially independent of a temperature of the power semiconductor device;
   comparing the determined value with a reference value; and
   outputting a signal indicative of an aging state of the power semiconductor device responsive to a difference between the determined value and the reference value;
   wherein the power semiconductor device includes a diode and the act of determining includes determining a voltage drop via sensing leads electrically connected to an anode and a cathode of the diode.

24. The method of claim 23 wherein the act of determining includes determining that the determined value is indicative of a voltage across the diode in response to a phase current measurement, and processing the determined value with control logic selected in response to the act of determining that the determined value is indicative of the voltage across the diode.

25. The method of claim 23 wherein the determined value includes an average value of the voltage in a plurality of sampling periods after placing the power semiconductor device in service in the electric drive system, and wherein the reference value includes a stored reference value indicative of a starting voltage across the power semiconductor device prior to service in the electric drive system.

26. The method of claim 1 wherein the power semiconductor device includes a transistor and a freewheeling diode, the act of energizing the electric drive system causes current to flow alternately through the transistor and the freewheeling diode, and the act of determining includes performing a phase current measurement to determine whether the determined value is indicative of a voltage across the transistor or a voltage across the freewheeling diode and processing the determined value with different control logic depending upon whether the determined value is indicative of the voltage across the transistor or the voltage across the freewheeling diode.

27. The electric drive system of claim 26 wherein the act of determining is performed using detection circuitry comprising:
   a first resistor string coupled between a first input and a clamping component to monitor a first voltage of a collector of the transistor or a cathode of the freewheeling diode, the clamping component including a reference voltage terminal that compensates for different voltage drop ranges associated with the transistor and the freewheeling diode;
   a second resistor string coupled to a second input to monitor a second voltage of an emitter of the transistor or an anode of the freewheeling diode, and
   an operational amplifier configured to compare the first voltage sensed via the first input with the second voltage sensed via the second input.

28. The electric drive system of claim 12 wherein power semiconductor device includes a transistor and a freewheeling diode, the controller is structured to energize the electric drive system to cause current to flow alternately through the transistor and the freewheeling diode, and the controller is structured to determine the determined value by performing a phase current measurement to determine whether the determined value is indicative of a voltage across the transistor or a voltage across the freewheeling diode and processing the determined value with different control logic depending upon whether the determined value is indicative of the voltage across the transistor or the voltage across the freewheeling diode.

29. The electric drive system of claim 28 wherein the sensing mechanism comprises:
   a first resistor string coupled between a first input and a clamping component to monitor a first voltage of a collector of the transistor or a cathode of the freewheeling diode, the clamping component including a reference voltage terminal that compensates for different voltage drop ranges associated with the transistor and the freewheeling diode;
   a second resistor string coupled to a second input to monitor a second voltage of an emitter of the transistor or an anode of the freewheeling diode, and
   an operational amplifier configured to compare the first voltage sensed via the first input with the second voltage sensed via the second input.

* * * * *